United States Patent [19]
Cense et al.
[11] 3,813,603
[45] May 28, 1974

[54] INTEGRATED THRESHOLD CIRCUIT FOR STAGES WITH DIFFERENT CONTROL RANGES

[75] Inventors: Adriaan Cense; Jan Van Straaten, both of Nijmegen, Netherlands

[73] Assignee: U.S. Philips Corporation, New York, N.Y.

[22] Filed: Feb. 22, 1972

[21] Appl. No.: 228,169

[30] Foreign Application Priority Data
Mar. 6, 1971 Netherlands ........................ 7103018

[52] U.S. Cl. .................. 325/319, 325/404, 325/405, 325/409, 325/410, 325/415
[51] Int. Cl. ............................................ H04b 1/16
[58] Field of Search ........... 325/319, 404, 405, 410, 325/415, 409; 178/7.3 DC, 7.3 S, 7.5 DC, 7.5 S; 330/38 M

[56] References Cited
UNITED STATES PATENTS
3,319,177 5/1967 Aemmer ............................ 325/319
3,555,182 1/1971 Griepentrog ........................ 325/319

*Primary Examiner*—Albert J. Mayer
*Attorney, Agent, or Firm*—Frank R. Trifari; Henry I. Steckler

[57] ABSTRACT

An integrated threshold circuit for an automatic gain control circuit in a television receiver in which the possibility of a very limited number of connecting terminals is created without limiting the adjusting possibilities by a series arrangement of the emitter of a first transistor with the parallel arrangement of a diode and the base-emitter junction of a second transistor.

5 Claims, 2 Drawing Figures

INTEGRATED THRESHOLD CIRCUIT FOR STAGES WITH DIFFERENT CONTROL RANGES

The invention relates to an integrated threshold circuit for an automatic gain control circuit of a television receiver.

The object of the invention is to provide a threshold circuit which has a minimum number of output terminals generally required for integrated gain controls, an output voltage range which is large relative to its supply voltage, which circuit can provide two output voltages which can be used for contiguous control ranges of at least two receiver stages with a well-defined transition between these control ranges.

To this end an integrated threshold circuit according to the invention is characterized in that it includes a first transistor whose base is the input of the threshold circuit, while the emitter is connected to the parallel arrangement of a diode and a base-emitter junction of a second transistor, the collector of the first transistor being connected with respect to direct current to a first connecting terminal of the integrated circuit for supplying a control voltage for one part of the television receiver and the collector of the second transistor being coupled with respect to direct current to a second connecting terminals of the integrated circuit for supplying a control voltage for another part of a television receiver.

By using the diode in parallel with the base-emitter junction of the second transistor it is achieved that an additional connection terminal for adjusting a suitable take-over region between the control ranges of the two parts is superfluous. This adjustment may be effected by connecting an adjustable or adapted resistor circuit to the first connecting terminal. The diode in parallel with the base-emitter junction of the second transistor than serves to fix the region in which the threshold value must be located during manufacture of the integrated circuit.

Furthermore the circuit according to the invention makes it quite possible to control two control stages having approximately the same input resistance as is generally required in practice.

Figure 1:
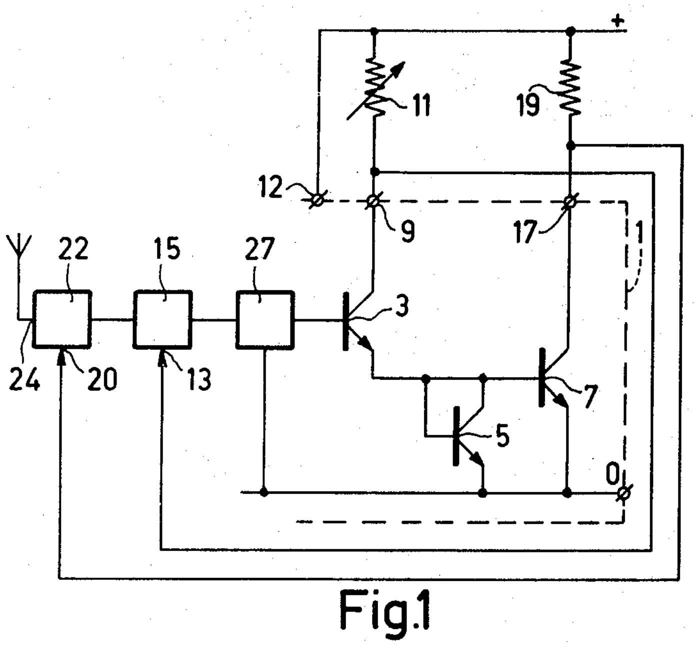
Figure 2:
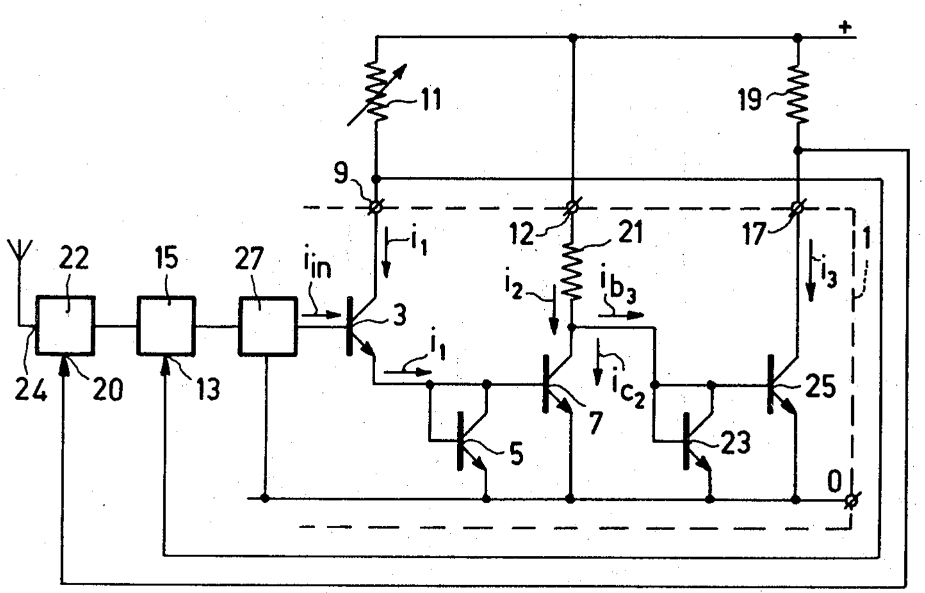

In order that the invention may be readily carried into effect, some embodiments thereof will now be described in detail by way of example with reference to the accompanying diagrammatic drawing in which:

FIG. 1 shows by way of a non-detailed principle circuit diagram a threshold circuit according to the invention, FIG. 2 shows likewise by way of a non-detailed principle circuit diagram a threshold circuit according to the invention with which control voltages of different levels and for different control devices can be obtained.

In FIG. 1 an integrated threshold voltage circuit 1 has a first npn transistor 3 whose emitter is connected to one end of a parallel arrangement of an npn transistor 5 arranged as a diode and the base-emitter junction of a second npn transistor 7, the other end of said parallel arrangement being coupled to a connecting terminal 0 of a supply source.

The collector of the first transistor 3 is coupled to a first connecting terminal 9 of the threshold circuit 1. This first connecting terminal 9 is coupled through a resistor 11 to a positive voltage supply (+) and it is furthermore connected to a control voltage input 13 of an intermediate frequency amplifier 15 of a television receiver. Furthermore, the positive voltage supply is coupled to a terminal 12 of the integrated circuit 1 so that, for example, other circuits also integrated with the threshold circuit can be fed.

The collector of the second transistor 7 is coupled to a second connecting terminal 17 of the threshold circuit 1. This second connecting terminal 17 is coupled through a resistor 19 to the positive voltage supply (+) and furthermore it is connected to a control input 20 of an RF section 23 of the television receiver.

The RF section 22 receives a television signal through an input 24 which signal is converted into an intermediate frequency signal. This IF signal is amplified by the IF amplifier 15, detected and again detected with the aid of an automatic control voltage signal detector 27 and is converted into a control voltage which is applied to the base of the first transistor 3.

When a television signal of low intensity is received at the input 24 the control voltage signal detector 27 provides a voltage such that the first transistor 3 and also the second transistor 7 are saturated and the output voltages at the first and second connecting terminals 9 and 17 are low so that the amplifications of the RF and IF sections 23 and 15 are at a maximum.

When the signal intensity at the input 24 increases, the voltage at the base of the first transistor 3 decreases. This first transistor 3 is no longer saturated at a given signal value and its collector current decreases so that the output voltage at the first conducting terminal 9 increases and the amplification of the IF section 15 decreases. The current flowing through transistor 3 furthermore flows through the parallel arrangement of the diode 5 and the base-emitter junction of the second transistor 7. The second transistor 7 remains saturated. It is true that part of this current flows through the diode 5, but the remaining part is still sufficient to saturate the second transistor 7.

The resistor 11 and the ratio between the surfaces of the diode 5 electrodes and the base-emitter electrodes of the second transistor 7 are chosen to be such that only when the collector current at the first transistor has decreased to, for example, less than fifteen to twenty percent of its value in case of saturation, the current flowing through the second transistor 7 becomes sufficiently low so as to cause this transistor to come out of its saturated state so that the collector voltage of the second transistor will also increase in case of a further decrease of the voltage at the base of the first transistor 3. The collector voltage of the first transistor 3 can then increase to a slight extent so that the control of the IF section 15 is substantially discontinued and the control of the receiver is taken over by the RF section 21.

The control voltage derived from the connecting terminals 9 and 17 has a large variation with respect to the supply voltage because in case of saturation of the transistors 3 and 7 the voltage thereacross is substantially zero and may be equal to the supply voltage in the cut-off state of the transistors 3 and 7.

Since the control of the RF section, as described above, commences below a given value of the collector current flowing through the first transistor 3, the voltage value associated with this collector current is to be chosen together with the choice of the value of resistor 11 and consequently this voltage value is to be adapted to the control range of the IF section 15. As a result a clearly defined take-over of the control by the RF section 22 can be achieved. The resistor 11 may be provided entirely or partly outside the integrated circuit 1 and if desired it may be of a variable type. Since the resistor 11 is located between a supply terminal and the first connecting terminal 9, an additional connecting terminal need not be present for this purpose in the circuit. For a current ratio suitable in many cases for the diode 5 and the base-emitter junction of the second transistor 7 approximately one sixth of the current amplification factor of the second transistor 7 is a favourable value. As is shown in the drawing the diode 5 in an integrated circuit will generally be a transistor arranged as a diode. The desired current ratio is then achieved in a simple manner by the choice of the ratio between the base-emitter surface of the second transistor 7 and that of the transistor 5 arranged as a diode which in the given case must be approximately six. As may be known, the ratio between the base-emitter junction surfaces of the second tranistor 7 and the transistor 5 arranged as a diode represents the current amplification factor of the combination.

The circuit of FIG. 2 differs from that of FIG. 1 in the following respects.

The second transistor 7 of the threshold circuit 1 and the transistor 5 arranged as a diode are now proportioned in a different ratio and serve as an inverter circuit so as to obtain a different direction of the control voltage variation at the second connecting terminal 17. Therefore the collector of the second transistor is connected through a resistor 21 to the supply terminal 12 and is furthermore coupled to the interconnection of the collector and the base of an npn transistor arranged as a second diode 23 and to the base of a third npn transistor 25 whose collector is connected to the second connection terminal 17.

The RF section 22 is now assumed to be of a kind which require a control voltage in the opposite direction relative to that of FIG. 1.

The operation of the inverter circuit is as follows. The current in the emitter circuit of the first transistor 3 is passed on to the collector circuit of the second transistor 7 at an amplification factor which is, for example, substantially one. Thus, the ratio between the surface of the base-emitter junction of the second transistor 7 and that of the base-emitter junction of the diode 5 is in this case taken to be substantially one. The value of resistor 21 in the collector lead of the second transistor 7 is chosen to be so high that in the case of the second transistor 7 being cut off the current flowing through the third transistor 25 is sufficiently high to saturate this transistor. The voltages at the collectors of the transistor 7 and 25 then vary in an exactly opposite manner.

When the ratio between the surface of the base-emitter junction of the third transistor 25 and that of the transistor 23 arranged as the second diode is rendered equal to the desired ratio of the saturation values of the first transistor prior to the occurrence of the maximum current and the current at which the threshold in the control of the RF section 22 is exceeded, hence for example approximately six, the same control is obtained as in the case of FIG. 1 on the understanding that the control voltage at the second connecting terminal 17 varies in the opposite sense from a maximum to a minimum with a decreasing value of the voltage at the base of the first transistor 3 after the voltage at the first connecting terminal 9 has exceeded a further value determined by the resistor 11.

Although favourable values of surface ratios are stated in the foregoing for the commonly used loads through the control inputs 13 and 20 of the receiver sections 15 and 22, it will be evident that these values may be chosen to be different without passing beyond the scope of the invention.

Instead of resistor 11 the input resistors of the control inputs 13 and 20 may alternatively be adapted to the desired take-over range.

The control slopes of the sections 15 and 22 connected to the connecting terminals in corporation with the threshold circuit may be adapted if desired by a choice of surface ratios and/or load resistors other than stated above.

Furthermore it is possible to combine the circuit of FIG. 1 with that of FIG. 2 by the parallel arrangement of the inputs connected to the emitter of the first transistor 3 of the further circuits which are different in the two Figures, while control voltages which vary below a threshold value of the input voltage in a negative sense and control voltages which vary in a positive sense can be obtained.

Furthermore it will be evident that although using npn transistors in these embodiments as the transistors currently commenly used for integrated circuits, it is alternatively possible to use transistors of the other type.

The choice of the different magnitudes for the circuit of FIG. 2 will also be described with reference to a calculation.

Assume that: $i_{in}$ = input current of the threshold circuit, hence the current flowing to the base of the first transistor 3

$i_1$ = the collector current of the first transistor 3 which is substantially equal to the input current of the diode transistor combination 5, 7

$i_2$ = the current through resistor 21

$i_{c_2}$ = the collector current of the second transistor 7.

$i_{b_3}$ = the current to the diode-base combination at the input of the third transistor 25

$i_3$ = the current flowing through resistor 19

$V$ = the supply voltage $B_1$ = the current amplification of the first transistor 3.

$B_2$ = the current amplification of the diode-transistor combination 5, 7

$B_3$ = the current amplification of the diode transistor combination 23, 25

$V_{be_2}$ = the junction voltage of the second transistor 7

$V_{be_3}$ 1 the junction voltage of the third transistor 25

$V_9$ = the voltage at connecting terminal 9

$V_{c_2}$ 1 the collector voltage of the second transistor 7.

$V_{17}$ = the voltage at connecting terminal 17. Furthermore it is assumed that the collector current of the transistors is substantially equal to their emitter current.

Then $i_1 = B_1 i_{in}$

Hence $V_9 = V - B_1 i_{in} R_{11}$

Furthermore $i_{c_2} = B_2 B_1 i_{in}$

Hence $V_{c_2} = V - i_2 R_{21} = V - B_2 B_1 i_{in} R_{21} - i_{b_3} R_{21} = V_{be}$ Consequently $i_{b_3} = V - V_{be}/R_{21} - B_2B_1i_{in}$
Then $i_3 = B_e i_{b_3} = B_3\ V - V_{be}/R_{21} - B_3B_2B_1i_{in}$
And $V_{17} = V - B_3\ R_{19}/R_{21}\ (V - V_{be}) + B_3B_2B_1i_{in}R_{19}$
With $0 \leq V_{17} \leq V$ and $0 \leq V_9 \leq V$ When the first transistor 3 has just come out of its saturated state there applies that $$V_9 = V_{be_2} = V - B_1i_{in}\ R_{11}$$

For the corresponding current value $i_{in_1}$ of the input current there applies $$i_{in_1} = V - V_{be_2}/B_1R_{11}$$

When the third transistor 25 has just started to conduct there applies that $$V_{17} = V$$

Consequently $$B_3B_2B_1i_{in_2}R_{19} = B_3\ R_{19}/R_{21}\ (V - V_{be_3})$$

or $$i_{in_2} = (V - V_{be_3})/B_2B_1R_{21}$$

Assume the ratio between the current values $i_{in_1}$ and $i_{in_2}$ which the control voltage ranges at the two outputs 9 and 17 commence, to be equal to $p$ Then $$p = i_{in_1}\ /i_{in_2} = B_2B_1R_{21}/B_1R_{11}\ \lambda(V - V_{be_3})/V - V_{be_2} = B_2(R_{21}/R11)$$

because $$V - V_{be_3}/V - V_{be_2} = 1.$$

or $$B_2 = p\ R_{11}/R_{21} \qquad (1)$$

In order to cause $V_{17}$ to proceed from O to V the expression must furthermore be as follows:

$$V_{17} = V - B_3\ (R_{19}/R_{21})\ (V - V_{be}) + B_3B_2B_1\ i_{in}R_{19}$$

$$V - B_3\ (R_{19}/R_{21})\ (V - V_{be}) \leq 0$$

or $$B_3\ (R_{19}/R_{21}) \geq 1$$

That is to say $$R_{21} \leq B_3R_{19} \qquad (2)$$

For example $$R_{21} = B_3R_{19}$$

$p$, $R_{11}$ and $R_{19}$ are substantially fixed by the requirements imposed by the further control circuit. Either $B_3$ or $B_2$ or $R_{21}$ can be freely chosen so as to satisfy the conditions (1) and (2). To obtain a favourable ratio of currents and resistances in the threshold circuit it is assumed that $B_2 = 1$. To satisfy condition (1) there applies that $$(R_{21}/R_{11})\ 1\ p \text{ or } R_{21} = pR_{11}$$

and to satisfy condition (2) for a large control range there applies that $$R_{21} \leq B_3R_{19}$$

Hence $pR_{11} \leq B_3R_{19}$ for example $B_3R_{19}$ and since in practice $R_{11}$ is mostly equal to $R_{19}$ there applies that $B_3 \geq p$ for example $B_2 = p$

What is claimed is:

1. A circuit for controlling the gain of two sections of a receiver in accordance with an automatic gain control signal, said circuit comprising first and second transistors each having emitter, base, and collector electrodes; a first uni-directional conducting means coupled to said first transistor emitter and parallel coupled to said second transistor base and emitter; said first transistor base comprising input means for receiving said gain control signal; and first and second terminal means direct current coupled to said first and second transistor collectors respectively for supplying output signals to control the gains of said sections respectively, one of said terminals also comprising a threshold delay adjustment receiving means for ensuring that the control ranges of said output signals with respect to said input signal differ.

2. A circuit as claimed in claim 1 wherein said second transistor collector is directly connected to said second terminal.

3. A circuit as claimed in claim 1 further comprising a resistor coupled between said second transistor collector and said second terminal; a second unidirectional conducting means coupled to second transistor collector; and a third transistor having emitter and base electrodes parallel coupled to said second unidirectional conducting means, and a collector electrode direct current coupled to said second terminal.

4. A circuit as claimed in claim 2 wherein said first unidirectional conducting means comprises a fourth transistor having an emitter coupled to said second transistor emitter, and a base and a collector coupled toegether and to said second transistor base, the ratio of the surface of said second transistor base-emitter junction and that of the surface of said fourth transistor base-emitter junction being between four and ten, said ratio being equal to the ratio of the current in said second transistor when unsaturated to that of the current in said first transistor when unsaturated.

5. A circuit as claimed in claim 3 wherein said first and second unidirectional conducting means comprise fourth and fifth transistors respectively, each having an emitter coupled to said second and third transistor emitters respectively, and base and collector electrodes coupled to each other and to said fourth and fifth transistor bases respectively, the ratio of the second transistor base-emitter junction surface to that of the fourth transistor base-emitter junction surface is substantially equal to one and the ratio of said third transistor base-emitter junction surface to that of said fifth transistor base-emitter junction surface is between four and 10.

* * * * *

PO-1050
(5/69)

UNITED STATES PATENT OFFICE
CERTIFICATE OF CORRECTION

Patent No. 3,813,603 Dated May 28, 1974

Inventor(s) ADRIAAN CENSE ET AL

It is certified that error appears in the above-identified patent and that said Letters Patent are hereby corrected as shown below:

col. 5, line 27, cancel "$\lambda$";

line 28, change "$B_2(R_{21}/R11)$" to -- $B_2R_{21}/R11$ --;

Signed and sealed this 17th day of September 1974.

(SEAL)
Attest:

McCOY M. GIBSON JR.
Attesting Officer

C. MARSHALL DANN
Commissioner of Patents